United States Patent
Sone et al.

(10) Patent No.: US 6,404,042 B1
(45) Date of Patent: Jun. 11, 2002

(54) SUBCARRIER AND SEMICONDUCTOR DEVICE

(75) Inventors: Minoru Sone; Akira Tanioka; Motoyasu Morinaga; Hideo Furuyama, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/472,143

(22) Filed: Dec. 27, 1999

(30) Foreign Application Priority Data

Dec. 28, 1998 (JP) .............................. 10-374552

(51) Int. Cl.[7] .................. H01L 23/38; H01L 23/10; H01L 23/34
(52) U.S. Cl. .................. 257/678; 257/930; 257/706; 257/707; 257/712
(58) Field of Search .................. 257/930, 433, 257/434, 706, 707, 712, 713

(56) References Cited

U.S. PATENT DOCUMENTS 5,065,226 A * 11/1991 Kluitmans et al. ............ 357/74
5,510,649 A * 4/1996 Adhihetty et al. .......... 257/675
5,757,999 A * 5/1998 Tabuchi et al. ............... 385/93

FOREIGN PATENT DOCUMENTS

| JP | 405299777 A | * 12/1993 |
| JP | 10-214437 | 8/1998 |
| JP | 411087852 A | * 3/1999 |

* cited by examiner

Primary Examiner—Eddie Lee
Assistant Examiner—Joseph Nguyen
(74) Attorney, Agent, or Firm—Finnegan, Henderson, Farabow, Garrett & Dunner, L.L.P.

(57) ABSTRACT

A chip mount structure called "subcarrier" and semiconductor device capable of efficiently retaining the temperature of a semiconductor element at a constant level by a Peltier cooler without degrading the signal transmission characteristics of a module even when the atmospheric environment for use in the module changes in outside air temperature are provided. The subcarrier includes an element support unit that is high in thermal conductivity and also an element wiring unit of low thermal conductivity. Increasing the thermal conductivity of element support unit makes it possible to provide superior heat conduction between the semiconductor element and Peltier cooler whereas decreasing the element wiring unit's thermal conductivity enables elimination of radiation and absorption or exchange of heat from the top and side surfaces thereof, which in turn leads to an ability to greatly suppress or minimize the thermal load relative to the Peltier cooler.

2 Claims, 7 Drawing Sheets

SUBCARRIER AND SEMICONDUCTOR DEVICE

BACKGROUND OF THE INVENTION

The present invention relates generally to subcarrier structures and semiconductor devices. More particularly but not exclusively, this invention relates to subcarrier structures for use in immovably mounting a variety of types of semiconductor elements including but not limited to semiconductor lasers, which are preferably adapted to be built in Peltier cooler-associated optical semiconductor modules. The invention also relates to semiconductor devices employing such subcarriers.

Electronic component support structures or packages called "subcarriers" are typically employed to immovably mount a wide variety of types of semiconductor elements including semiconductor lasers and transistors or else. The subcarriers are required to make use of a certain material with preselected thermal expansion coefficient for suppression or "moderation" of possible thermal distortion in view of longevity of a semiconductor element used. It is also required that the material be excellent in thermal conductivity to facilitate or "accelerate" outward escape of heat radiated from semiconductor elements toward an outer housing or package enclosure with increased efficiency. The subcarriers include those using optical semiconductor elements, such as for example semiconductor lasers or light-emitting diodes (LEDs) or else, some examples of which will be described below.

Most optical semiconductor elements are variable in characteristics with a change in temperature. Accordingly, in those optical conductor modules as required to offer constant characteristics, a subcarrier that mounts one or more semiconductor elements as used therein is likewise required to let these elements remain constant in temperature during operations. To do this, the subcarrier is designed to employ cooling means. In case the optical semiconductor elements are in high-speed modulation modes, it will also be required that electrical lead wiring be done by use of a specific strip line pattern which has a prespecified impedance value and is formed to extend up to "nearby" portions of such optical semiconductor elements.

During such modulation operations the subcarrier can experience creation of electrical capacitance between the Earth or ground plane of a optical semiconductor element on the subcarrier and the underlying Peltier cooler, which would affect modulation signals. The higher the signal transmission frequency, the greater the influence. Thus, at higher transfer frequencies, the subcarrier should be arranged so that the capacitance stays less in value. One prior known approach to reducing the ground-to-cooler capacitance is to increase the thickness of the subcarrier as rigidly mounted on the Peltier cooler.

Another problem faced with the related art subcarrier structure lies in its limited cooling/heating abilities. This would result in limitation of temperature differences between the optical semiconductor element and its outside atmosphere. To achieve increased temperature differences therebetween, it is required to minimize heat radiation and absorption or thermal exchange relative to the subcarrier held on the Peltier cooler. This also leads to improvements in efficiency.

See Fig 7. This figure of drawing illustrates, in cross-section, one related art modulator-associated optical semiconductor laser diode module, also known as electroabsorption modulator laser (EML) module among those skilled in the art to which the invention pertains. The module contains a subcarrier as mounted therein. At part (a) of this drawing, there is depicted a planar sectional view of the EML module whereas part (b) shows its side view in cross-section. In FIGS. 7(a)–(b), reference numeral "71" designates an EML chip; numeral 72 denotes a subcarrier for rigid attachment of the EML chip; 73 indicates a thermistor for detection of the temperature of the EML chip; 74 shows a photodiode (PD) chip for detection of the amount of light intensity as emitted from the EML chip; 75 is a sub-mount member for fixation of the PD; 76, a glass window as immovably attached to a PKG 81 for permitting outward radiation of light from the EML chip; 78, a metal plate for tightly jointing said lens holder and subcarrier together; 79, a lens for collection of light from the EML chip; 80, a lens holder made of a metallic material for fixation of said lens 79; 81, a package (PKG) of the EML module; 82, a Peltier cooler for temperature control of the EML chip; 83, electrical leads of the PKG 81; 84, bonding wires of gold (Au) for electrical interconnection with the leads 83; 85, a terminate end resistor at which more than one terminate-end resistor of the modulator in the EML chip is formed; 87, an isolator for use in preventing production of return light from the outside; 88, a coupling lens for introducing light emitted from the EML into an optical fiber; 89, optical fiber; 90, ferrule holder for securing the optical fiber 89 to isolator 87; and, 91, link plate (bridge) as formed in the PKG for fixation of the PD sub-mount.

The EML chip 71 is mounted with its junction facing up side. The EML 71 includes a laser unit consisting essentially of a semiconductor laser diode (LD) and also an optical modulator unit for modulation of the intensity of light emitted from the former. The subcarrier 72 for rigidly supporting this EML chip 71 is made of an electrically insulative material with good thermal conductivity, such as for example aluminum nitride (AlN) ceramics. The subcarrier 72 has its top surface on which several electrodes are provided, which include an electrode for fixation of the EML chip 71, 50-Ohm microstrip line pattern for use in inputting electrical signals to the modulator unit of the EML chip 71, more than one electrode for electrical connection to the thermistor, and electrode(s) for electrical connection to the laser unit of EML chip 71.

In the EML module thus arranged, light emitted from the EML element 71 is collected by the condensing lens 79 and is then optically guided to pass through the glass window 76 attached to the PKG 81 and next penetrate inside of the isolator 87 to finally reach the optical fiber 89 via the coupling lens 88.

Note that the characteristics of the EML element 71 can vary with changes in temperature. In view of this, the EML module is designed so that the thermistor 73 is operable to detect the temperature of EML chip 71 for rendering the Peltier cooler 82 operative by using temperature adjuster circuitry, not shown, to thereby control the temperature of EML element 71.

Also note that transmission signals are sent to the EML element 71 by the 50-Ohm strip line pattern on a microstrip substrate. Unfortunately, certain electrical capacitance can take place between the electrodes formed on the surface of the subcarrier 72 and its associated Peltier cooler. Thus, in order to suppress influence of such capacitance with respect to transmission signals, it is required that the subcarrier 72 be designed to have an increased thickness at a specified value or greater. In practical implementation, transmitting signals at 10 Gbits per second (Gbps) requires the subcarrier 72 to measure in thickness approximately 2 millimeters (mm) or more.

EML modules are such that the outside air temperature is often variable due to the fact that these modules are to be installed for usage under a variety of kinds of environments. In addition, current is injected into the laser unit of the EML element resulting in generation of heat due to its inherent internal resistivity, which in turn causes the element to increase in temperature. The EML element's characteristics will change as the temperature changes. It is thus required that the EML be used with its temperature made constant during operation thereof. To this end, the EML module is designed so that the thermistor 73 detects the temperature of such EML element to generate a detection signal, which is used to appropriately adjust the cooling/heating performance of Peltier cooler 82 thus stabilizing the temperature so that it stays at a constant level or therearound.

However, as previously stated, the subcarrier 72 must be designed to increase in thickness to measure 2 mm or greater. Additionally, as the subcarrier has on its surface an electrical lead pattern including EML chip connection leads and thermistor connection leads, the subcarrier 72 is a few millimeters in width, which is far greater than the width of EML chip. In addition, the related art subcarrier 72 is made of those materials of good thermal conductivity, such as aluminum nitride (AlN) ceramics.

The above design factors would result in an increase in heat radiation and/or absorption from the top surface and side surfaces of the subcarrier. More specifically, the heat incoming and outgoing from the subcarrier may include not only heat components between the subcarrier and the ELM element but also those as input to and output from the subcarrier's top and side surfaces. The greater the heat components, the larger the load with respect to the Peltier cooler. One possible approach to avoiding this problem is to employ a high-performance Peltier cooler with increased cooling/heating ability. Regrettably, advantages of the high-performance Peltier cooler do not come without accompanying a penalty—such cooler is large in size so that the resulting EML module becomes bulky accordingly. The increase in performance can also result in increases in electrical power dissipation of the Peltier cooler. This in turn raises another problem that external circuitry for use in electrically driving or "feeding" such Peltier cooler must also increase in capacity.

BRIEF SUMMARY OF THE INVENTION

The present invention has been made by recognition of presence of the problems faced with the related art. It is therefore a primary object of the invention to provide a subcarrier structure and semiconductor device capable of constantly retaining the temperature of a semiconductor element built therein with increased efficiency by use of a Peltier cooler without reducing or degrading the inherent signal transmission characteristics of a module even upon changing of the temperature of outside environments for usage of the module.

To attain the foregoing object the present invention provides a subcarrier comprising an element support section for immovably supporting a semiconductor element and an element wiring section with more than one electrode for electrical connection to the semiconductor element on its first principal surface, wherein the element support section has its lower part made of a first dielectric material having first thermal conductivity whereas the element wiring section has its lower part made of a second dielectric material having second thermal conductivity less than the first thermal conductivity.

The instant invention also provides a semiconductor device featured by comprising the subcarrier stated above, and a semiconductor element secured to the element support section.

A semiconductor device is also provided which is featured by comprising the subcarrier noted previously, a semiconductor element secured to the element support section, and a cooler device secured to a second principal surface of the subcarrier opposite to the first principal surface thereof.

Alternatively the invention provides a semiconductor device featured by comprising the subcarrier above, a semiconductor element secured to the element support section, and a cooler device secured to a second principal surface of the subcarrier opposite to the first principal surface thereof, wherein the subcarrier further includes a container section air-tightly enclosing the optical semiconductor element and having a window for permitting transmission of light as emitted from the optical semiconductor element.

More practically, the subcarrier structure incorporating the principles of the invention is a semiconductor element-mounting subcarrier made of an electrically insulative or dielectric material for use in immovably supporting or mounting a semiconductor element with electrodes for electrical connection to the semiconductor element being formed thereon, featured by including an element support section whereat the semiconductor element is rigidly mounted and an element wiring station table which lies around the element support section and on which electrodes are formed, wherein these components are made of materials different in thermal conductivity from each other in a way such that the former is better in thermal conductivity than the latter while causing them to be integrally secured together.

Alternatively, the invention provides a subcarrier with a multilayer structure employing a Peltier cooler supporting the subcarrier with a metal plate sandwiched therebetween, which cooler offers enhanced cooling ability for appropriate incremental/decremental adjustment of the temperature of a semiconductor element used, featured in that a groove is provided between the subcarrier's element support section and element wiring section, and that contact is made only at limited part between the metal plate and the lower surface of the element support section or between the element support section's lower surface and the element wiring section's lower surface portion in close proximity to the element support section while providing a groove between the metal plate and the element wiring section's lower surface.

Still alternatively the invention provides a subcarrier structure featured in that a metal plate is secured to the lower surface of the aforesaid subcarrier, that a wall made of a dielectric material is provided on a surface on which lead electrodes for electrical connection to an optical semiconductor or optical semiconductor element are formed while causing part of such optical semiconductor element connection lead electrodes to be exposed at outer peripheries of an element wiring section except for a front surface of the optical semiconductor element, that a metallic wall is further provided and rigidly secured to the upper surface of this wall made of the dielectric material and a lateral surface of the element wiring section made of a dielectric material on the light emission side of the optical semiconductor element of an element support section plus the above-noted metal plate without any gaps defined therebetween, that an opening or aperture is formed in the metallic wall on the side of the optical semiconductor element light emission side for permitting outward escape of light emitted from the optical semiconductor element, and that this light-outgoing aperture for use with the optical semiconductor element is associated with either a glass plate or an optical condensing lens being adhered thereto with no gaps therebetween, the lens being for collecting light from the optical semiconductor element.

DESCRIPTION OF THE PREFERRED EMBODIMENTS

Some preferred embodiments of the present invention will now be explained with reference to the accompanying drawings below.

Figure 1:
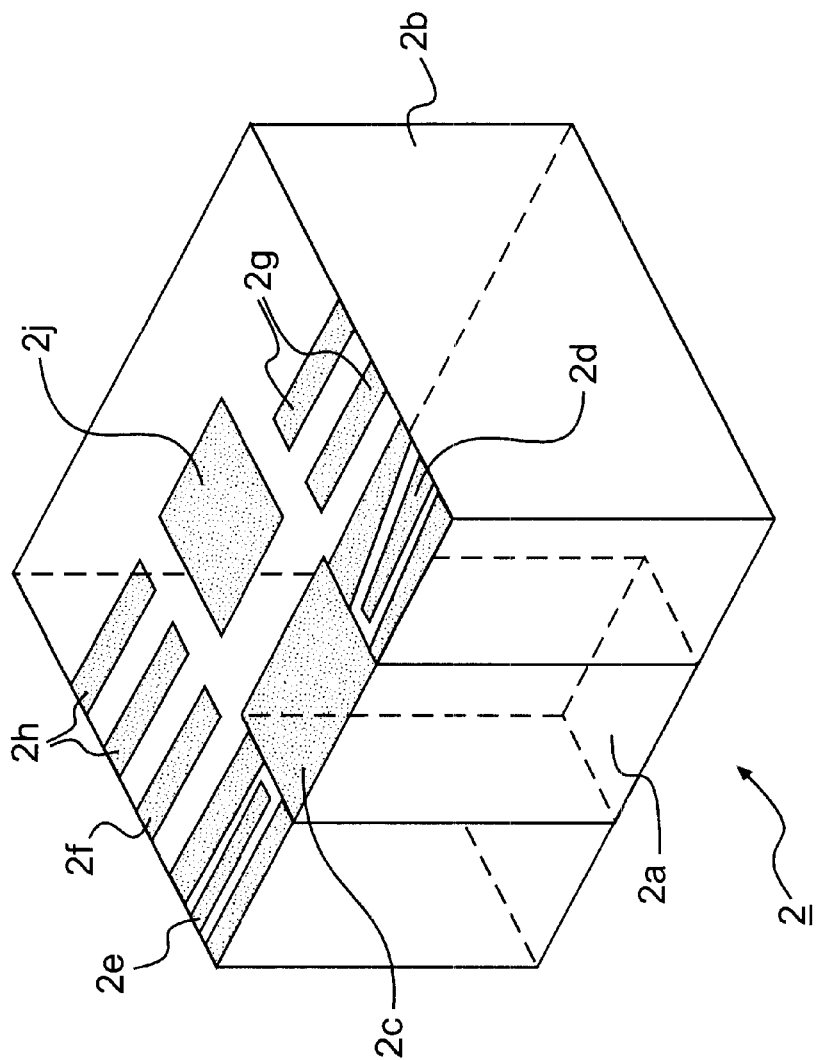
FIG. 1 is a diagram showing a perspective view of a subcarrier structure in accordance with one preferred embodiment of the present invention.

Referring first to FIG. 1, there is illustrated a subcarrier structure in accordance with one embodiment of the invention. As shown herein, the subcarrier is generally designated by numeral 2. The subcarrier 2 is for use in mounting thereon an optical semiconductor element including a laser or light-emitting diode (LED) or else. One principal feature of the illustrative subcarrier 2 is that it comprises an element support section 2a and element wiring section 2b. The element support unit 2a is for mounting the optical semiconductor element and is made of an electrically insulative or dielectric material that is high in thermal conductivity. The element wiring unit 2b is made of a chosen dielectric material low in thermal conductivity.

More specifically, as shown in FIG. 1, the subcarrier 2 has on its top surface several electrode/lead pattern segments, including a ground electrode 2c for immovably supporting an optical semiconductor element (not shown) which may be a semiconductor laser diode chip with its built-in optical modulator, also known as electroabsorption modulator laser (EML) chip, a signal-input lead electrode 2d for connecting of such EML chip modulator, a lead electrode 2e for connection to the terminator resistor of EML chip modulator, a lead electrode 2f for use with a semiconductor laser (LD) of the EML chip, a lead electrodes 2g for use with a thermistor, a lead electrodes 2h adapted to be coupled to a PD-submount, and an electrode 2j for rigid support of the PD-submount.

The EML chip modulator signal-input lead electrode 2d and EML chip modulator terminator resistor connection lead electrode 2e are coplanar microstrip lines with its characteristic impedance of 50 Ohms. As the LD and thermistor plus PD are not designed to offer high-speed modulation and high-speed signal receive functionalities, the remaining lead electrodes 2f–2h of the subcarrier 2 which are to be coupled there to may be standard electrodes rather than microstrip lines.

The element support unit 2a is formed of a rectangular rod-like member having on its top surface the ground electrode 2c for mounting the EML chip. The element wiring unit 2b is formed of a U-shaped block having on one lateral side a rectangular cutaway portion, which corresponds in shape and dimension to the rod-like member to thereby permit their tight engagement together. The element support unit 2a is made of a specified material high in thermal conductivity such as for example aluminum nitride (AlN) ceramics. Element support unit 2a may alternatively be made of other similar suitable materials, including silicon carbide (SiC), silicon (Si), etc. Element wiring unit 2b is made of a chosen material of low thermal conductivity, such as ceramics, glass or else.

The element support unit 2a is adherently attached by known brazing or soldering techniques at the cutaway portion to the element wiring unit 2b, providing an integral block base structure as a whole as shown in FIG. 1. The resultant subcarrier 2 measures approximately 2 millimeters (mm) in height, about 7 mm in depth, and about 8 mm in width. The top surface of element support unit 2a is a square plane that measures about 1.5 mm per side. As will be discussed in detail later, the subcarrier 2 thus arranged is placed and fixedly mounted on a cooling/heating means such as a Peltier cooler in a way such that subcarrier 2 is in contact therewith on its bottom surface, which is opposite to the top surface on which the electrode pattern is formed.

With the subcarrier 2 of FIG. 1 embodying the invention, the element support unit 2a is high in thermal conductivity so that any heat radiated from the EML chip behaves to flow into the Peltier cooler (not shown in FIG. 1) with increased efficiency. This in turn permits establishment of good thermal conduction between the EML chip and Peltier cooler. On the contrary, as the element wiring unit 2b is low in thermal conductivity, heat radiation and absorption at its top and side surfaces is limited thereby enabling great suppression or minimization of the thermal load with respect to the Peltier cooler.

Figure 2:
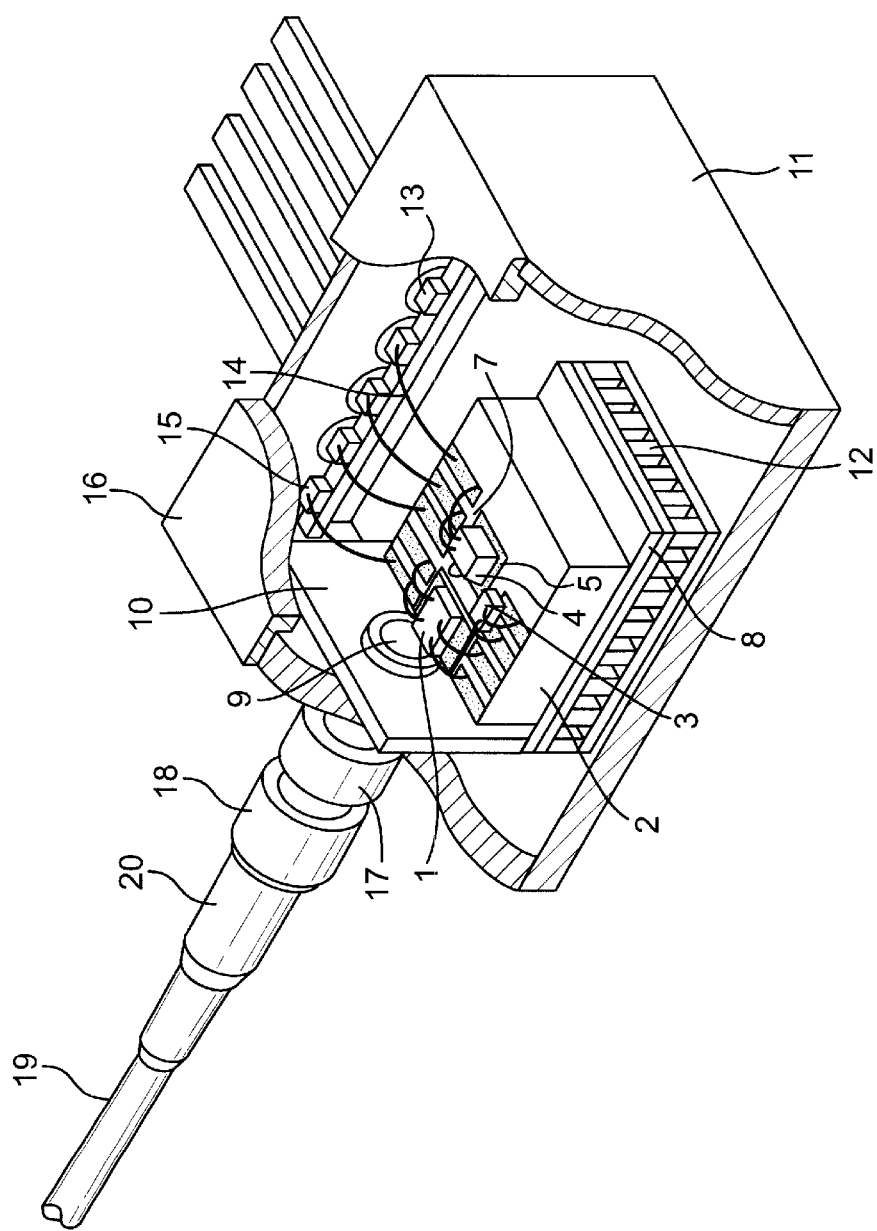
FIG. 2 is a diagram illustrating a partly broken perspective view of a semiconductor device mounting therein the subcarrier embodying the invention.

Turning now to FIG. 2, there is depicted a partly broken perspective view of a semiconductor device employing the subcarrier 2 of FIG. 1 as internally mounted therein. The illustrative semiconductor device is a optical semiconductor module. In FIG. 2, reference numeral "1" designates an EML chip; numeral 2 denotes the subcarrier; 3 indicates a thermistor for use in detecting the temperature of EML chip 1; 4 shows a photodiode (PD) chip for detection of the intensity of light as emitted from EML chip 1; 5 is a PD mount table or "bed" for adherent attachment of the PD chip 4 to subcarrier 2; 7, bonding wires for electrical connection between the subcarrier 2's lead electrodes and associative electronic parts, i.e. the EML chip 1 and thermistor 3 plus PD mount bed 5; 8, a metal plate for rigidly supporting the optical semiconductor element subcarrier 2, which plate extends toward the light emission side of EML chip 1; 9, a first optical lens for collecting light emitted from EML chip 2; 10, metal holder for support of the first lens 9; 11, package (PKG) of the EML module; 12, Peltier cooler for temperature adjustment of the subcarrier 2; 13, lead terminals of the PKG; 14, gold (Au) wires for connection between the PXG's lead terminals and subcarrier 2; 15, terminator resistors of the modulator of EML chip 1 inside of the PKG; 16, a PKG lid for sealing the interior of PKG; 17, isolator for precluding creation of return light to EML chip 1; 18, second condensing lens; 19, optical fiber.

An assembly method of the EML module containing the optical semiconductor element mount subcarrier 2 embodying the invention is as follows. First, use AuGe-soldering techniques (at melting point of 356° C.) to let the subcarrier 2 be rigidly attached to the metal plate 8. When this soldering is done, it will hardly happen that the optical semiconductor support unit 2a is accidentally detached from the element wiring unit 2b due to the fact that these parts 2a, 2b are tightly adhered by soldering together in advance.

Then, use AuSn soldering (at melting point of 280° C.) to fixedly mount the EML chip 1 on the element support unit 2a of subcarrier 2. Prior to such soldering, PD chip 4 has been secured by AuSn soldering to PD mount bed 5 with the PD chip wire-bonded to its associative electrode leads (no specific reference numerals are added thereto) of the PD mount bed 5.

Next, place the thermistor 3 and PD mount bed 5 mounting thereon PD chip 4 at prespecified layout positions on the subcarrier 2's element wiring unit 2b; then, adhere them to unit 2b by AgSn soldering (at melting point of 221° C.). Thereafter, wire bonding is done to connect the EML chip 1 and thermistor 3 plus PD mount bed 5 to the lead electrodes 2d–2h of subcarrier 2.

Next, place the first lens 9 for collection of light, which is received in the metal holder 10, on the metal plate 8 extending toward the light emission side of EML chip 1; then, perform center point adjustment while rendering the EML chip operative for light emission to thereby complete position alignment required. Thereafter, use laser welding techniques to adhere them together. Here, the Peltier cooler 12 has been secured by InPbAg soldering (at melting point of 149° C.) to the EML's PKG 11.

Thereafter, adhere the chip-assembled metal plate 8 by BiSn soldering (at melting point of 139° C.) onto the Peltier cooler 12. Then, let the resultant fixed subcarrier 2's electrodes be connected by bonding Au wires 14 to the lead terminals 13 within the PKG. Note that the modulator's terminator resistors 15 have been formed inside of the PKG. Then, attach the PKG lid 16 to the PKG by seam-welding techniques to thereby seal the interior space of the PKG. Thereafter, place in the PKG the isolator 17 and second condensing lens 18 plus optical fiber 19; then, after having carefully adjusted the center positions thereof for precise position alignment, use laser welding to secure such respective parts thereto.

With the EML module of FIG. 2 using the subcarrier 2 embodying the invention, it becomes possible to constantly retain the temperature of EML chip 1 at a preselected level, by letting the thermistor 3 detect the temperature of EML chip 1 as secured to the subcarrier 2 and then allowing external temperature control circuitry to supply a drive current to the Peltier cooler. Whereas the AlN's thermal conductivity measures 170 W/m·K, the thermal conductivity of ceramics used is at 18 W/m·K—the former is approximately ten times greater in value than the latter. Due to such thermal conductivity value difference, in cases where the EML chip is set at a temperature of 25° C. and its ambient temperature is 70° C. for example, the EML chip 1 is efficiently refrigerated or cooled by the Peltier cooler via the subcarrier 2's element support unit 2a while simultaneously suppressing or minimizing a flow of heat from the internal space of the PKG because of the arrangement that the remaining surfaces of the Peltier cooler are covered or "thermally shielded" by the element wiring unit 2b that is low in thermal conductivity. In other words, it is possible to efficiently cool the EML chip 1 alone, which in turn makes it possible to suppress any other unwanted heat radiation/absorption. It is thus possible to greatly lighten the thermal load with respect to the Peltier cooler.

According to the present invention, an increase in cooling efficiency may advantageously result in a decrease in power dissipation of the module when compared to the related art. In addition the thermal load reducibility enables use of those Peltier coolers smaller in size than ever before, which in turn makes it possible to downsize the module accordingly.

Another advantage of the instant invention is that temperature differences between the optical semiconductor element and outside environments may become greater than in the related art. In other words it is possible to expand an environmental temperature range for permitting use of the module so that it is greater than in the related art. One example is that where the module is adapted for use as an interexchange or trunk repeater device in optical data communications networks, such module may stably operate with enhanced reliability even under "severe" environmental conditions at over-the-spec temperatures that are higher or lower than traditionally accepted temperature values.

A further advantage of the invention lies in capability of achieving enhanced temperature controllability to ensure that the temperature of the optical semiconductor element used stays within a prespecified optimal temperature range in all events This in turn makes it possible to preclude any possible degradation of such optical semiconductor element thereby lengthening lifetime while at the same time increasing long-term operability and reliability.

An explanation will next be given of a second embodiment of the invention.

Figure 3:
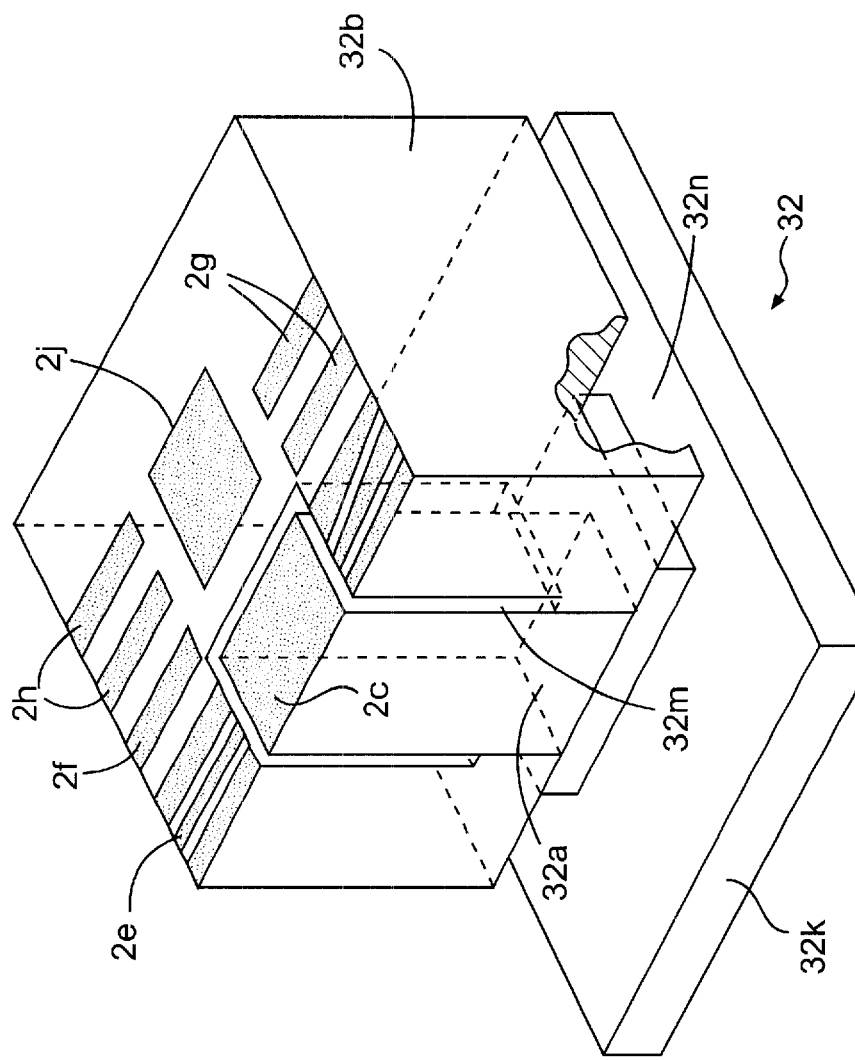
FIG. 3 is a diagram depicting a perspective view of a subcarrier structure in accordance with another embodiment of the invention.

Turning to FIG. 3, there is illustrated a partly broken perspective view of a subcarrier structure in accordance with the second embodiment of the invention. This embodiment is more excellent than that shown in FIG. 1 in temperature adjustment efficiency so that the former offers further enhanced optical semiconductor element temperature adjustability, which results in an increase in temperature difference between an EML chip and outside environments of a PKG installed therein.

Specifically, in FIG. 3, numeral 32 designates a subcarrier, which is structured from an element support unit 32a made of a dielectric material with high thermal conductivity and an element wiring unit 32b of a dielectric material that is low in thermal conductivity. Additionally, "2c" designates a ground electrode on which the EML chip is immovably mounted; 2d denotes a modulator input side lead electrode of the EML chip; 2e indicates a lead electrode as connected to a terminator resistor of the EML chip modulator; 2f represents a lead electrode for use with a semiconductor laser (LD) of EML chip; 2g is lead electrodes for use with a thermistor; 2h, lead electrodes connected to a PD-submount; 2j, an electrode for use in fixedly supporting the PD submount. The electrodes 2c–2j maybe similar in configuration as those discussed in conjunction with FIG. 1 and, therefore, any detailed explanation thereof is eliminated herein.

In FIG. 3, "32k" designates a metal plate for stably supporting thereon the element support unit 32a and element wiring unit 32b together, which plate extends toward the light emission side of an EML chip 31; 32*m* denotes a groove as formed between the element support unit 32*a* and element wiring unit 32*b*; 32*n* is a gap space as defined between element wiring unit 32*b* and its underlying metal plate 32*k*. Element support unit 32*a* and element wiring unit 32*b* are integrally adhered together and rigidly secured to metal plate 32*k* by using soldering materials or other similar suitable adhesive materials.

The element support unit 32*a* is made of AlN whereas element wiring unit 32*b* is of ceramics. The size of element support unit 32*a* is such that this unit measures approximately 2 mm in height and about 1.5 mm in width and depth. The groove 32*m* between element support unit 32*a* and element wiring unit 32*b* is about 0.3 mm in width and 1.5 mm in depth; the gap 32*n* between element wiring unit 32*b* and metal plate 32*k* is 0.5 mm wide.

In this embodiment also, the element support unit 32*a* is made of a specific material of high thermal conductivity whereas the element wiring unit 32*b* is of a material low in thermal conductivity whereby similar advantages to those noted in conjunction with the FIG. 1 embodiment are obtainable.

One feature unique to the embodiment of FIG. 3 is that the groove 32*m* is provided between the element support unit 32*a* and element wiring unit 32*b* for preventing or at least greatly reducing radiation/absorption or exchange of heat therebetween. Another feature of the embodiment is that the gap 32*n* is provided between element wiring unit 32*b* and metal plate 32*k* to thereby noticeably suppress heat exchange therebetween. These features make it possible to further limit the heat flow path between element wiring unit 32*b* and metal plate 32*k* as compared to the embodiment of FIG. 1.

To be brief, according to the FIG. 3 embodiment, it becomes possible to achieve superior heat conduction between the EML chip and Peltier cooler while simultaneously greatly suppressing or minimizing heat exchange at the top and side surfaces of element wiring unit 2*b*, which may in turn enable further significant reduction of the thermal load with respect to the Peltier cooler.

Figure 4:
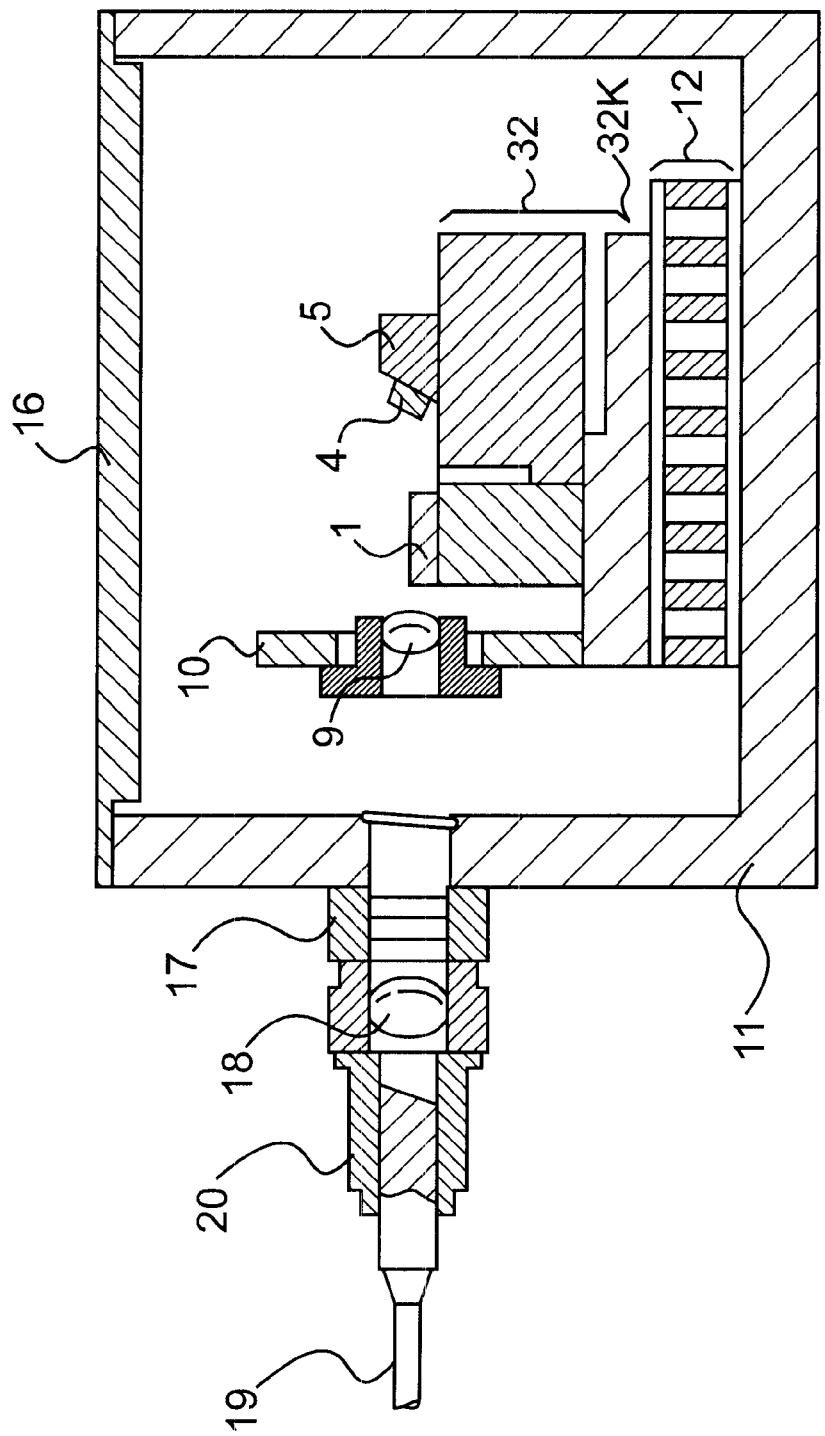
FIG. 4 is a diagram for pictorial representation of a sectional view of a semiconductor device internally mounting the subcarrier shown in FIG. 3.

Referring next to FIG. 4, there is depicted in cross-section a semiconductor device equipped with the subcarrier of FIG. 3 therein. This illustrative device is a optical semiconductor module. In FIG. 4, like reference characters are used to designate like parts or components similar to those used in the module of FIG. 2. Specifically, in FIG. 4, 1 denotes an EML chip; 32 designates a subcarrier; 4 shows a PD chip for detection of the intensity of light as emitted from EML chip 1; 5 is a PD mount bed for immovably supporting the PD chip 4 on the optical semiconductor element subcarrier 32; 9, first lens for collecting light emitted from EML chip 1; 10, metallic holder for supporting first lens 9; 11, EML module package (PKG); 12, Peltier cooler for temperature adjustment of optical semiconductor element subcarrier 32; 16, PKG lid for sealing inside of the PKG; 17, isolator for preventing creation of return light to EML chip 1: 18, second condensing lens; 19, optical fiber; 20, ferrule holder.

The EML module using the subcarrier 32 embodying the invention is similar in assembly methodology to that shown in FIG. 2 except that the metal plate 32*k* is initially secured to the optical semiconductor element subcarrier 32.

The thermal conductivity of AlN is set at 170 W/m·K whereas that of ceramics is 18 W/m·K—the former is virtually ten times greater in value than the latter. Accordingly, the module of FIG. 4 also offers advantages similar to those attainable by that of FIG. 2.

A further feature unique to this embodiment, that is a semiconductor device of FIG. 4 equipped with the subcarrier of FIG. 3, is that the groove 32*m* is provided between the element support unit 32*a* and element wiring unit 32*b* for reducing any possible radiation/absorption or exchange of heat between them. Still further feature of it is that the gap space 32*n* is also formed between element wiring unit 32*b* and metal plate 32*k* to thereby suppress any direct heat exchange therebetween. This in turn makes it possible to significantly suppress a flow of heat as radiated from and absorbed to the inside space of the PKG via the upper and lateral side surfaces of element wiring unit 32*b*.

As a result of this, according to the above embodiment, the Peltier cooler for use in constantly retaining the temperature of the optical semiconductor within the module may be further improved in efficiency to thereby permit setup of greater temperature differences between the EML chip 1 and outside environments in which the PKG is placed for installation. In other words it becomes possible for this embodiment to let the Peltier cooler 12 efficiently perform temperature control or adjustment with respect only to the EML chip 1 while at the same time greatly reducing the thermal load of the Peltier cooler by blocking heat exchange via the element lead section 32*b*.

A further advantage is that forming the groove 32*m* between the element support unit 32*a* and element wiring unit 32*b* makes it possible to eliminate unwanted electrical short-circuiting otherwise occurring due to an out flow of AuSn soldering materials onto the electrodes 32*d*–32*f* on the element wiring unit 32*b*, the materials being used when mounting the EML chip 1 at a preselected position on the top surface of the element support unit 32*a*.

Although in the embodiment of FIG. 3 the element support unit 32*a* and element wiring unit 32*b* are designed to be in contact with each other at respective lower portions thereof, these are not necessarily be contacted together and equivalent advantages are obtainable even when the subcarrier is modified in structure in a way such that the element support unit 32*a* is partly secured at its bottom surface to the underlying metal plate 32*k* while the element wiring unit 32*b* is adhered at part of its bottom surface to the metal plate 32*k*.

A still another embodiment of the invention will next be explained below.

Figure 5:
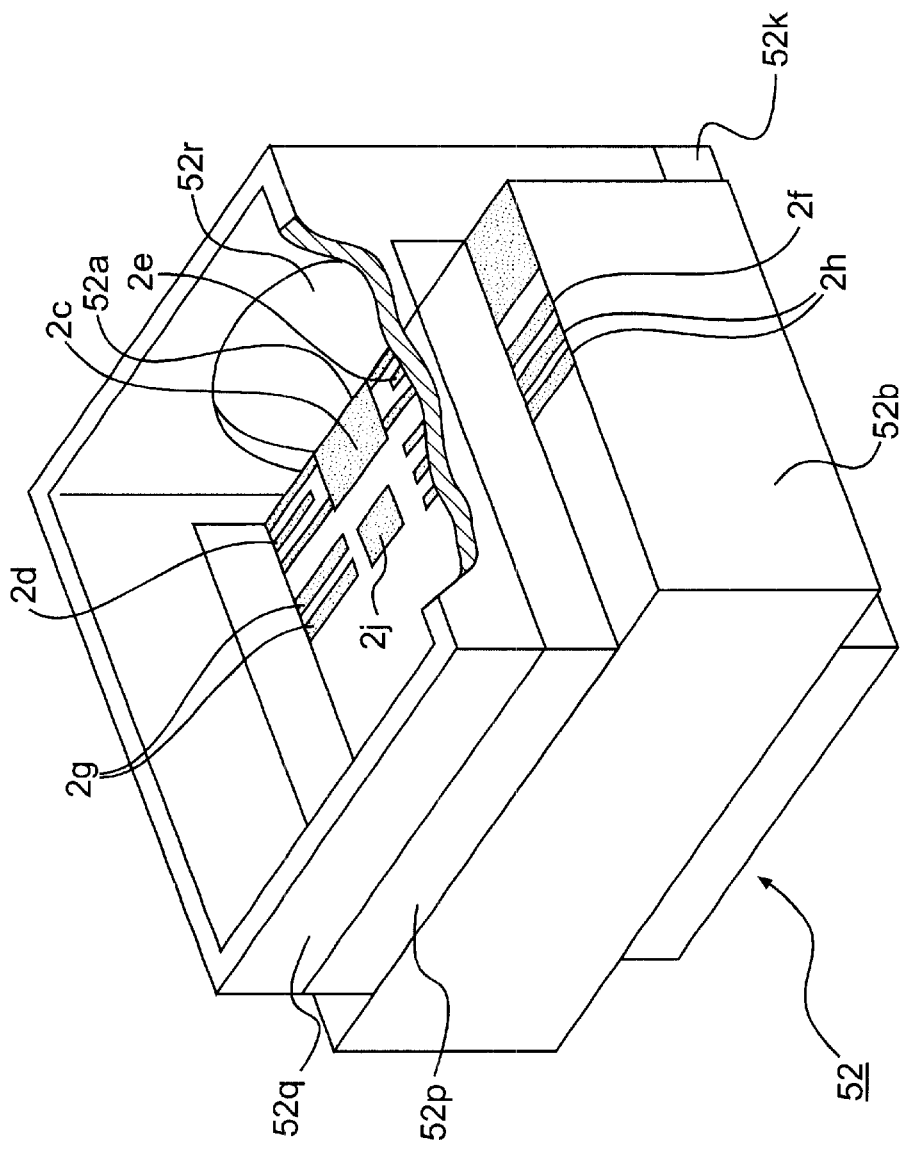
FIG. 5 is a diagram showing a partly broken perspective view of a subcarrier for use with an optical or optical semiconductor element in accordance with a still another embodiment of the invention.

See FIG. 5, which depicts a partly broken perspective view of a optical semiconductor element mount subcarrier structure in accordance with the third embodiment of the invention. This embodiment is featured in that an outer partition member or "container" frame is further provided for permitting establishment of sealed packaging of an EML chip and/or PD chip inside of the subcarrier while simultaneously offering enhanced temperature controllability for causing temperature differences between the EML chip and outside environments in which its PKG is installed to remain within a prespecified optimal range.

As shown in FIG. 5, a subcarrier 52 is formed of an element support unit 52*a* and element wiring unit 52*b*. The element support unit 52*a* is made of a dielectric material of good thermal conductivity whereas wiring unit 52*b* is of a dielectric material low in thermal conductivity. Note here that while FIG. 5 is the subcarrier's perspective view when looking at from the backside thereof, the element support unit 52*a* and element wiring unit 52*b* are similar in shape to those shown in FIG. 1 when viewing the subcarrier from its front side.

In FIG. 5, "2*c*" designates a ground electrode for fixation of the EML chip; 2*d* denotes a lead electrode on the input side of a modulator of the EML chip as formed on the subcarrier 52; 2e indicates a lead electrode formed on subcarrier 52 for connection to a terminator resistor of the EML chip modulator; 2f is a lead electrode formed on subcarrier 52 for use with a semiconductor laser (LD) of the EML chip; 2g is lead electrodes formed on subcarrier 52 as used for a thermistor; 2h, lead electrodes for PD as formed on subcarrier 52; 2j, electrode for securing a PD submount. The electrodes 2c–2j are similar in arrangement to those shown in FIG. 1 and hence a detailed explanation thereof is eliminated herein.

Additionally in FIG. 5, 52k denotes a metal plate projecting to the light emission side of the EML chip for use in immovably supporting thereon the element support unit 52a and element wiring unit 52b together; 52p designates an outer wall made of chosen dielectric materials low in thermal conductivity and formed to have a "U"-like planar shape, which is adhered to the top surface of the element wiring unit 52b at outer peripheries thereof; 52q is a metallic wall as contacted with the top surface of the outer wall 52p and with one lateral side surface of the element wiring unit 52b on the front side of the EML chip for enabling seam-welding of a lid thereon; 52r, glass window—or alternatively optical condensing lens—as formed in the metal wall 52q for allowing light emitted from the EML chip to escape toward outside of subcarrier 52.

Note that in FIG. 5, the metal wall 52q is partly cut away to render visible its internal configuration including the top surface of the carrier for clarity purposes only.

In this embodiment also, the element support unit 52a is made of a high thermal conductivity dielectric material such as for example AlN whereas element wiring unit 52b is of a low thermal conductivity dielectric material such as ceramics for instance.

The metal plate 52k is made for example of copper tungsten (CuW). The outer wall 52p is of ceramics. Metal wall 32q is of an iron-nickel-cobalt (Fe—Ni—Co) alloy. The element support unit 52a is sized so that it is approximately 2 mm in height and about 1.5 mm in width and depth. Outer wall 52p and metal wall 32q are each 2 mm in height, or more or less.

In this embodiment also, forming the element support unit 32a of high thermal conductivity materials while using low thermal conductivity materials for element wiring unit 32b makes it possible to achieve various advantages similar to those stated in conjunction with the embodiment shown in FIG. 1 or 3.

An additional advantage of the FIG. 5 embodiment lies in ability to attain air-tight or "sealed" enclosure of the optical semiconductor element while suppressing any possible optical axis deviation and also increasing mountability during module assembly processes with reliability increased, as will be described in more detail later.

Figure 6:
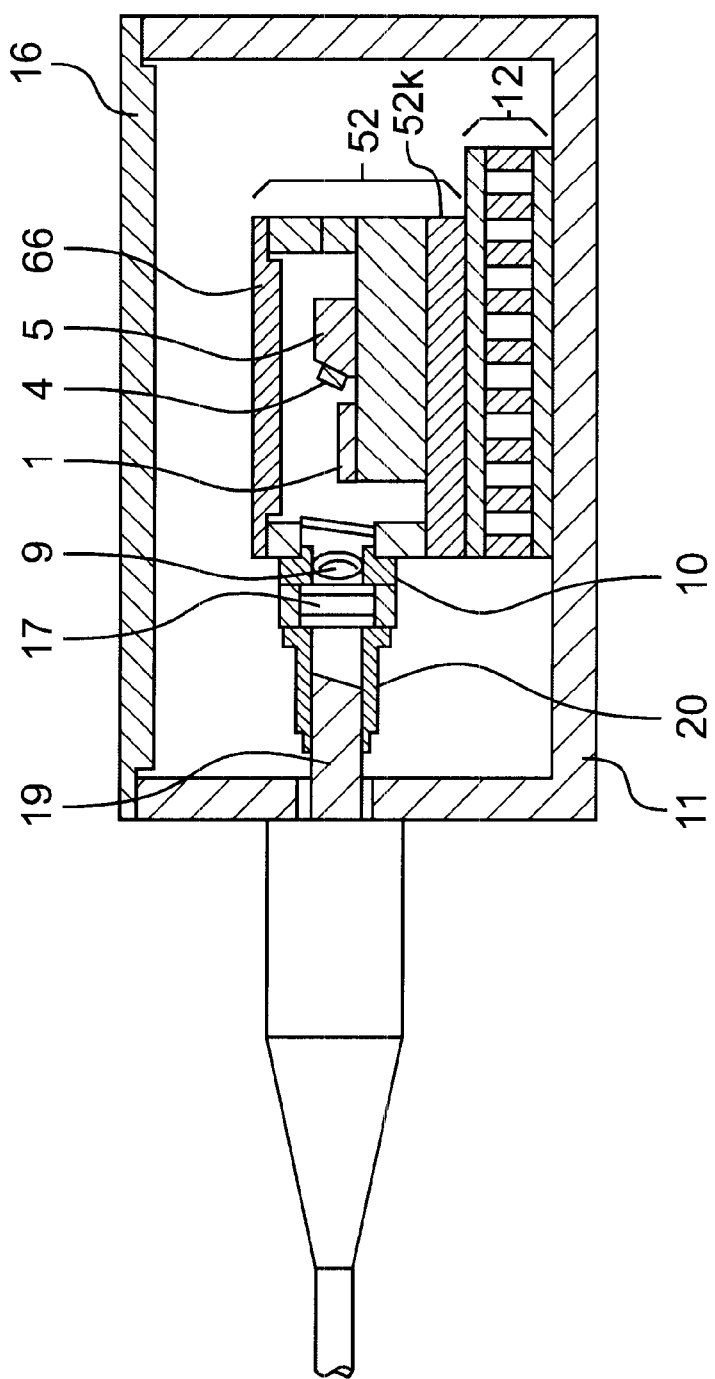
FIG. 6 is a diagram schematically illustrating in cross-section a optical semiconductor module mounting therein the subcarrier of FIG. 5.

Turning to FIG. 6, there is illustrated in cross-section a optical semiconductor module employing the subcarrier of FIG. 5 as built therein. In FIG. 6, parts or components similar to those in FIG. 2 are designated by similar reference characters used therein. Namely, in FIG. 6, numeral 1 denotes an EML chip; 52 is subcarrier, 4, photodiode (PD) chip for detection of the intensity of light emitted from EML chip 1; 5, PD mount bed supporting thereon PD chip 4; 9, lens for collecting light from EML chip 1; 10, metal holder supporting lens 9; 11, EML module package (PKG); 12, Peltier cooler; 16, PKG lid for closing the upper part of the PKG; 66, lid for sealing the upper part of subcarrier 52; 17, isolator for preventing return light to EML chip 1; 19, optical fiber; 20, ferrule holder.

An assembly method of the EML module shown in FIG. 6, that is employing the subcarrier of FIG.5 as built therein is as follows. First, immovably mount the EML chip 1 by AuSn soldering techniques (at melting point of 280° C.) to the element support unit 52a of the subcarrier 52. The PD chip 4 has been fixed by AuSn soldering to the PD mount bed 5 with the PD mount bed 5's electrode leads (not shown) wire-bonded to the PD chip. Thereafter, secure both the thermistor (not shown) and the PD mount bed 5 with PD chip 4 attached thereto by AgSn soldering (at melting point of 221° C.) to element wiring unit 52b at preselected positions thereon.

Then, wire-bonding is done to connect the EML chip 1 and thermistor (not shown) plus PD mount bed 5 to the lead electrodes 2f–2h of element wiring unit 52b, respectively. Let the lid 66 be seam-welded to subcarrier 52 for air-tight sealing of the interior of subcarrier 52. Thereafter, use laser welding techniques to immovably attach the lens 9 that has been secured to the metal holder 10 outside a glass window 52n to the metal wall 52q lying on the light emission side of the EML chip 1 after completion of center position adjustment between the lens 9 and EML chip 1.

Then, effectuate laser welding letting the return-light elimination isolator 17 be adhered to the metal holder 10 thus fixed. And, secure the optical fiber 19 via the ferrule holder 20 to the isolator 17 by laser welding techniques after position adjustment for precise alignment between the center point of optical fiber 19 and an optical path of output light of the EML chip 1. The PKG 11 has been subjected to InPbAg soldering (at melting point of 149° C.) f or fixation of Peltier cooler 12 thereto. Thereafter, let the air-tight sealed subcarrier 52's metal plate 52k (FIG. 5) be rigidly attached by BiSn soldering (melting point of 139° C.) to the upper surface of Peltier cooler 12. Connect by wires between the electrodes on the top surface of element wiring unit 52b (FIG. 5) thus fixed to corresponding lead terminals within the PKG 11.

The AlN's thermal conductivity measures 170 W/m·K whereas the thermal conductivity of ceramics is set at 18 W/m·K—the former is about ten times greater in value than the latter. Thus, the module of FIG. 6 also offers several advantages similar to those attainable by that of FIG. 2.

A further advantage of this embodiment lies in excellence of reliability due to the fact that the EML chip 1 and PD chip 4 are air-tightly sealed within subcarrier 52.

Figure 7A:
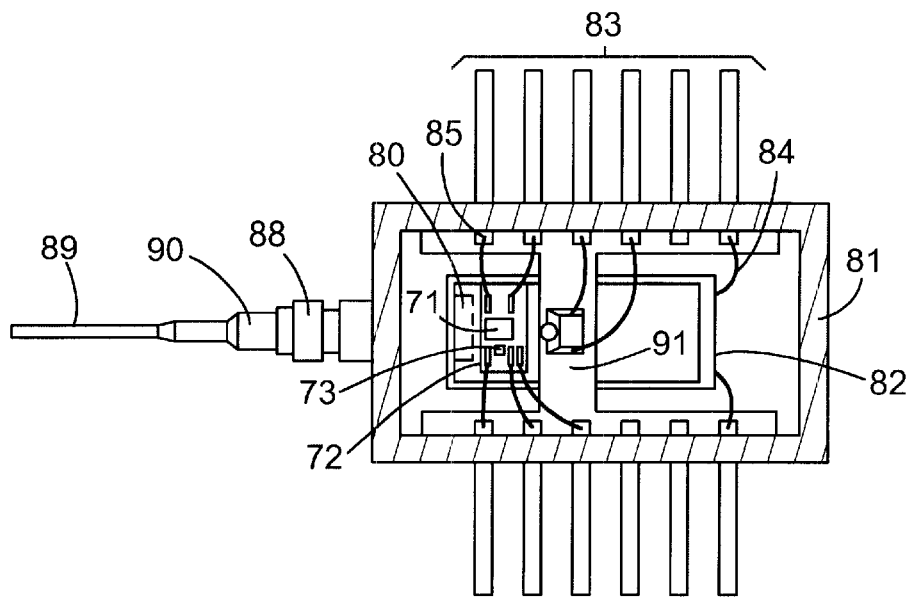
FIG. 7 is a sectional diagram for explanation of a related art electroabsorption modulator laser (EML) module including a modulator-associated optical semiconductor laser diode as mounted on a subcarrier therein, wherein part (a) of this drawing illustrates a cross-section of the EML module when looking at from the upper side thereof whereas part (b) depicts a cross-section thereof when looking at from its lateral side.
Figure 7B:
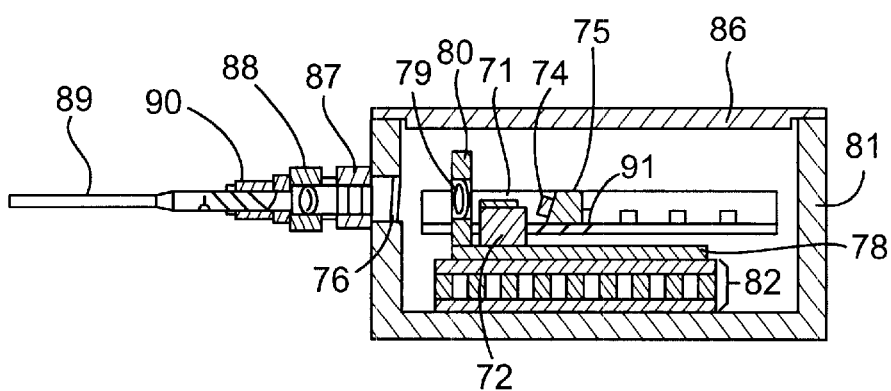

A yet further advantage of the embodiment is that as the EML chip 1 is optically coupled to optical fiber 19 by laser-welded and AuSn-soldered components, deviation will hardly occur in the resultant optical system thereby enabling achievement of well stabilized light output of the optical fiber during operations. On the contrary, the prior art module as exemplarily shown in FIG. 7 is designed to employ an "H"-like bridge member 91 in PKG 81 while mounting on this bridge a PD mount bed 75 equipped with a monitor PD. However, with such traditional structure, use of the bridge component serves as a bar to successful attachment of Peltier cooler 82 to inside of PKG 81.

In addition, while two separate lenses are provided for coupling light emitted from EML chip 71 to optical fiber 89, the first lens 79 is provided on Peltier cooler 82 whereas the second lens 88 is fixed on PKG 81. Due to such lens layout, Peltier cooler 82 with lens 88 secured thereto can slightly deviate in position from PKG 81. Slight deviation would disadvantageously result in an appreciable change in power of light reaching optical fiber 89.

To avoid this problem, it should be strictly required that soldering materials be sufficiently uniformly flown into all the boundaries between Peltier cooler 82 and PKG 81 for tight contact therebetween. Regrettably the presence of the "intervening" bridge 91 raises difficulty in rigidly securing Peltier cooler 82 and PKG 81 together. Additionally, although the monitor PD 74 for detection of light incoming from EML chip 71 must be precisely aligned in height with EML chip 71, inherent deviation risks including deviation in thickness of Peltier cooler 82 and irregularities of soldering thicknesses between Peltier cooler 82 and metal plate 78 and between Peltier cooler 82 and PKG 81 can result in tendency of unwanted offset in height of EML chip 71 and monitor PD 74, which causes a problem that any required optical detection amount will no longer be obtainable.

In contrast to such prior art module structure, the module of FIG. 6 embodying the invention is specifically arranged so that its EML chip 1 is tightly bonded via subcarrier 52 to lens 9 and optical fiber 19 with enhanced adhesiveness. This may in turn increase reliability and position alignment accuracy in assembling the module while reducing complexities and production costs thereof. Furthermore, risks of deviation in optical system couplement otherwise occurring due to application of mechanical shocks and vibrations and/or temperature variations may be reduced or minimized to ensure that light output of the optical fiber is well stabilized for an extended time period.

A further advantage of the embodiment is that optical axis offset risks may be eliminated while enhancing the stability of monitor outputs by virtue of its unique arrangement that the EML chip 1 and monitoring PD 4 are also mounted and secured to the top surface of subcarrier 52.

While the invention has been particularly shown and described with reference to preferred embodiments thereof, it will be understood by those skilled in the art that the invention should not be limited only to such illustrative embodiments and the foregoing and other changes in form and details may be made therein without departing from the scope of the invention.

For instance, the material selection and shape/size design used in the subcarrier of the invention are modifiable by experts in the art on a case-by-case basis, while retaining the intended functionalities and advantages stated supra.

The semiconductor element as built in the subcarrier incorporating the principles of the invention should not be limited only to the EML chip stated previously and may alternatively be any other electronic parts or components including but not limited to optical semiconductor elements, such as semiconductor lasers, LEDs, photosensitive elements or else, and integrated circuit (IC) components such as bipolar transistors, field effect transistors (FETs), thyristors, diodes, and others. Especially, the foregoing, inventive teachings may preferably be applicable to power devices and/or high-speed arithmetic circuit components that are inherently great in heat release/radiation amount; if this is the case, the invention is advantageous in enabling improvement of cooling efficiencies thereof.

The illustrative optical semiconductor module structures discussed above are mere examples to place. this invention in context. Such exemplary modules are also modifiable by a skilled person for implementation of the inventive concepts in a wide variety of different forms which offer the same or similar advantages above. One example is that although the above embodiments are principally directed to employing a cooling device such as Peltier cooler for refrigerating the semiconductor element such as EML chip on the subcarrier, the invention is also applicable to those using a heater device in lieu of the cooler, as the need arises, with similar effects and advantages maintained.

The present invention may be reduced to practice in form of several embodiments discussed previously while offering several effects and advantages which follow.

First, according to the invention, letting the element support section be high in thermal conductivity makes it possible to achieve excellent heat conduction between the EML chip and Peltier cooler while designing the element wiring unit 2b to be low in thermal conductivity makes it possible to limit unwanted heat radiation or absorption or "exchange" from its top and side surfaces, thereby to noticeably lighten the thermal load with respect to the Peltier cooler used.

In addition, according to this invention, it becomes possible to reduce the module's power dissipation than in the prior art. Additionally, the thermal load reduction makes it possible to downsize the Peltier cooler than ever, which in turn enables the module to be miniaturized accordingly.

Further, according to the invention, it is possible to attain a greater temperature difference between the optical semiconductor element and outside environments than in the prior art. In other words it is possible to expand the tolerance range of ambient atmosphere temperatures that guarantees failure—free operations of the module. For example, in case the module is designed for use as an interexchanger in optical communications systems, it becomes possible to enhance operational stabilities thereof even under sever conditions for usage at excessive temperatures higher or lower than ever before.

Furthermore, according to the invention, it is possible to achieve increased temperature controllability for letting the temperature of the optical semiconductor element stay constantly within a prespecified range during operation. This in turn makes it possible to reduce or eliminate degradation of such optical semiconductor element while at the same time retaining extended lifetime and enhanced reliability for a long time period.

Still further, according to the invention, providing the groove between the element support section and element wiring section while providing the gap space underlying the element wiring section makes it possible to greatly suppress heat exchange therebetween, which in turn enables further limitation of a flow path of heat between the element wiring section and its associative cooling means. In brief, any possible heat-in/heat-out activities at the element wiring section's top and side surfaces may be noticeably limited while attaining good thermal conduction between the optical semiconductor element and the cooler means operatively associated therewith to thereby further significantly lighten the thermal load with respect to the cooler means.

Moreover, according to the invention, the reliability may also be increased by provision of a container housing for permitting achievement of sealed packaging of any selected semiconductor element on the subcarrier.

Furthermore, according to the invention, the semiconductor element used is rigidly secured via the subcarrier to its associated lens and optical fiber. Thus, the module assembly is made easier with increased position alignment accuracy and reliability while reducing manufacturing costs. Further, the optical system couplement will hardly be deviated upon application of mechanical shocks and/or vibrations or alternatively temperature changes, which in turn makes it possible to increase operational stability of light output of the optical fiber for an extended time period.

In addition, as the optical semiconductor element and the monitoring PD are also fixedly mounted on the subcarrier, any risk of optical axis offset may be avoided increasing the stability of monitor outputs.

As apparent from the foregoing description, according to the invention, it becomes possible to provide a variety of types of semiconductor devices capable of significantly reducing the thermal load with respect to the Peltier cooler while reducing size and power dissipation and yet retaining high performance and increased reliability, which is thus believed to bring great merits in industry.

What is claimed is:

1. A semiconductor device comprising:

a semiconductor element;

a subcarrier comprising:

an element support section having a first surface, said element support section made of a first electrically insulative material having a first thermal conductivity;

an electrode formed on said first surface of said element support section, said semiconductor element being fixed on said electrode;

an element wiring section having a second surface, said element wiring section made of a second electrically insulative material having a second thermal conductivity less than said first thermal conductivity of said first electrically insulative material;

a wiring formed on said second surface of said element wiring section, said wiring electrically connected to said semiconductor element;

a metal plate secured to a lower surface of said subcarrier;

a dielectric wall provided on an upper surface of the subcarrier;

a metallic wall rigidly secured to an upper surface of said dielectric wall, wherein the electrode of the element wiring section is exposed at outer peripheries of said element wiring section except for a front surface of said semiconductor element;

wherein said semiconductor element emits light in a light emission direction;

a lateral surface of said element wiring section on the side in the light emission direction being made of a dielectric material;

wherein no gap is defined between said element support section and said metal plate; and wherein an aperture is formed in said metallic wall on the side in the light emission direction for permitting outward escape of light emitted from said semiconductor element;

the aperture being associated with either a glass plate or an optical condensing lens and the glass plate or the optical condensing lens being adhered to the aperture with no gaps therebetween.

2. A semiconductor device comprising:

a semiconductor element;

a subcarrier comprising:

an element support section having a first surface, said element support section made of a first electrically insulative material having a first thermal conductivity;

an electrode formed on said first surface of said element support section, said semiconductor element fixed on said electrode;

an element wiring section having a second surface, said element wiring section made of a second electrically insulative material having a second thermal conductivity less than said first thermal conductivity of said first electrically insulative material;

a wiring formed on said second surface of said element wiring section, said wiring electrically connected to said semiconductor element, wherein said support section and said wiring section are attached together;

a metal plate secured to a lower surface of said subcarrier;

a dielectric wall provided on an upper surface of the subcarrier;

a metallic wall provided and rigidly secured to an upper surface of said dielectric wall, wherein the electrode of the element wiring section is exposed at outer peripheries of said element wiring section except for a front surface of said semiconductor element;

said semiconductor element emitting light in a light emission direction;

a lateral surface of said element wiring section on the side in the light emission direction is made of a dielectric material;

wherein no gap is defined between said element support section and said above-noted metal plate; and wherein an aperture is formed in said metallic wall on the side in the light emission direction for permitting outward escape of light emitted from said semiconductor element;

the aperture being associated with either a glass plate or an optical condensing lens being adhered thereto with no gaps therebetween.

* * * * *